(12) United States Patent
Yu

(10) Patent No.: US 9,116,181 B2
(45) Date of Patent: Aug. 25, 2015

(54) METHOD, APPARATUS, AND SYSTEM FOR VIRTUAL CLUSTER INTEGRATION

(71) Applicant: HUAWEI TECHNOLOGIES CO., LTD., Shenzhen, Guangdong (CN)

(72) Inventor: Fan Yu, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 129 days.

(21) Appl. No.: 13/621,946

(22) Filed: Sep. 18, 2012

(65) Prior Publication Data

US 2013/0174152 A1    Jul. 4, 2013

Related U.S. Application Data

(63) Continuation of application No. PCT/CN2012/075458, filed on May 14, 2012.

(30) Foreign Application Priority Data

Dec. 29, 2011  (CN) .......................... 2011 1 0451066

(51) Int. Cl.
  *G06F 9/455* (2006.01)
  *G01R 21/00* (2006.01)
  *G06F 9/50* (2006.01)
(52) U.S. Cl.
  CPC ............... *G01R 21/00* (2013.01); *G06F 9/455* (2013.01); *G06F 9/5077* (2013.01);
  (Continued)
(58) Field of Classification Search
  None
  See application file for complete search history.

(56) References Cited

U.S. PATENT DOCUMENTS

2006/0253715 A1* 11/2006 Ghiasi et al. ................... 713/300
2010/0083010 A1*  4/2010 Kern et al. ..................... 713/300

(Continued)

FOREIGN PATENT DOCUMENTS

CN    101699368    4/2010
CN    101739113    6/2010

(Continued)

OTHER PUBLICATIONS

Entropy: a ConsolidationManager for Clusters Fabien Hermenier, Xavier Lorca, Jean-Marc Menaud, Gilles Muller, and Julia Lawall Published: 2009.*

(Continued)

*Primary Examiner* — Emerson Puente
*Assistant Examiner* — Paul Mills
(74) *Attorney, Agent, or Firm* — Staas & Halsey LLP

(57) ABSTRACT

Embodiments of the present invention relate to a virtual machine integration technology, and in particular, to a method, an apparatus, and a system for virtual cluster integration. The method includes: performing a calculation through a search algorithm to obtain the minimum number of physical machines which are capable of accommodating all virtual machines in a virtual cluster, and obtaining all virtual integration solutions satisfying the minimum number of physical machines; then calculating CPU voltage consumption of each virtual integration solution, and selecting a solution with lowest CPU voltage consumption from these virtual integration solutions; and formulating a virtual integration migration policy according to the virtual integration solution with the lowest CPU voltage consumption. Therefore, through the embodiments of the present invention, a virtual integration solution with lower CPU voltage energy consumption can be obtained, thereby greatly improving an energy saving and emission reduction effect of a virtual cluster integration solution.

15 Claims, 3 Drawing Sheets

(52) U.S. Cl.
CPC ......... *G06F 9/5094* (2013.01); *G06F 9/45533* (2013.01); *G06F 2009/4557* (2013.01); *Y02B 60/142* (2013.01); *Y02B 60/146* (2013.01); *Y02B 60/167* (2013.01)

(56) References Cited

U.S. PATENT DOCUMENTS

2011/0145559 A1    6/2011    Thomson et al.
2011/0289330 A1    11/2011    Gao et al.

FOREIGN PATENT DOCUMENTS

CN      102096461      6/2011
WO      2011/084332      7/2011

OTHER PUBLICATIONS

Multi-objective Virtual Machine Placement in Virtualized Data Center Environments Jing Xu and José A. B. Fortes Published: 2010.*
Energy-Efficient Server Clusters E.N. (Mootaz) Elnozahy, Michael Kistler, and Ramakrishnan Rajamony Published: 2003.*
A dynamic optimization model for power and performance management of virtualized clusters Vinicius Petrucci, Orlando Loques, and Daniel Mossé Published: 2010.*
Frame-Based Dynamic Voltage and Frequency Scaling for a MPEG Decoder Kihwan Choi, Karthik Dantu, Wei-Chung Cheng, and Massoud Pedram Published: 2002.*
Power: A First-Class Architectural Design Constraint Trevor Mudge Published: 2001.*
Application Performance Management in Virtualized Server Environments Gunjan Khanna, Kirk Beaty, Gautam Kar, Andrzej Kochut Published: 2006.*
Performance and Energy Modeling for Live Migration of Virtual Machines Haikun Liu, Cheng-Zhong Xu, Hai Jin, Jiayu Gong, Xiaofei Liao Published: Jun. 11, 2011.*
What Science is and how it Works Gregory Derry Chapter 19: The Straight and Narrow: Linear Dependence in the Sciences Published: 2002.*
Co-management of Power and Performance in Virtualized Distributed Environments Mohsen Sharifi, Mahsa Najafzadeh, and Hadi Salimi Published: May 13, 2011.*
A Power and Performance Management Framework for Virtualized Server Clusters Yongqiang Gao, Zhengwei Qi, Yubin Wu, Rui Wang, Liang Liu, Jitao Xu, Haibing Guan Published: Aug. 2011.*
Power-Aware Scheduling of Virtual Machines in DVFS-enabled Clusters Gregor von Laszewski, Lizhe Wang, Andrew J. Younge, Xi He Published: 2009.*
Energy-Efficient Management of Data Center Resources for Cloud Computing: A Vision, Architectural Elements, and Open Challenges Rajkumar Buyya, Anton Beloglazov, and Jemal Abawajy Published: 2010.*
International Search Report issued Oct. 4, 2012 in corresponding International Patent Application No. PCT/CN2012/075458.

\* cited by examiner

METHOD, APPARATUS, AND SYSTEM FOR VIRTUAL CLUSTER INTEGRATION

CROSS-REFERENCE TO RELATED APPLICATIONS

This application is a continuation of International Application No. PCT/CN2012/075458, filed on May 14, 2012, which claims priority to Chinese Patent Application No. 201110451066.9, filed on Dec. 29, 2011, all of which are hereby incorporated by reference in their entireties.

FIELD OF THE INVENTION

The present invention relates to virtual cluster technologies, and in particular, to a method, an apparatus, and a system for virtual cluster integration.

BACKGROUND OF THE INVENTION

A server virtualization technology is a key technology based on an infrastructure layer in cloud computing. Deployment of multiple virtual machines (virtual operating systems) on a single physical node is implemented by virtualizing a physical server, so that a resource utilization ratio of the physical server can be improved and the cost of using can be reduced. In a virtual cluster, such multiple physical machines are managed unifiedly; in this way, through a virtualization technology, physical resources are abstracted into a resource pool formed by various resources such as storage, computing, and a network, and a virtual machine applies for a resource according to requirements and is deployed in the cluster.

One important characteristic of the virtual cluster is dynamic resources scheduling (Dynamic Resources Scheduling, DRS) (an important characteristic which is established on the basis of live migration of the virtual machine): A cluster management system monitors resource utilization ratios of each physical machine and virtual machine at regular time, and according to resource distribution conditions, adjusts distribution of virtual machines on physical machines by utilizing live migration, so as to implement load balance and cluster integration in the cluster range, thereby improving resource usage efficiency of each host and at the same time ensuring that each host bears proper loads. In virtual cluster integration, resource requirements in the virtual cluster are continuously monitored. During a period of a low utilization ratio, a resource requirement of the cluster decreases, workloads are integrated into a few physical machines and a host of another unused physical machine is turned off to decrease power consumption of the cluster. During a period of a high utilization ratio, resource requirements of workloads increase, and the host which is turned off is online again to ensure that a service level is met. The virtual cluster integration brings the following values: a power consumption cost and a heat dissipation cost of a data center are reduced, and energy efficiency of the data center is managed automatically.

In the existing virtual cluster integration technology, the minimum number of physical machines is taken as an integration target to find a proper migration policy for the virtual machine. Cluster solutions of main virtualization vendors (VMware and Citrix) all include a related virtual cluster integration technology. Distributed power management (Distributed power management, DPM) of VMware completes its virtual cluster integration, where an unnecessary physical machine is powered off to achieve an effect of energy saving and emission reduction. Its main mechanism process is: When a load of the whole cluster is lower than a threshold value for a period of time, the DPM first determines the minimum number of physical machines according to resource distribution conditions, and then gives virtual machine migration (the virtual machine is enabled to migrate from a physical machine with light loads to a physical machine with heavy loads as far as possible) and physical machine power-off instructions according to distribution conditions of virtual machines of physical machines in a current cluster, and executes virtual machine migration according to the migration instruction given in the foregoing; and the physical machine from which virtual machines are all migrated is powered off, so as to achieve a purpose for saving energy. However, under the circumstance that currently the scale of the virtual cluster is expanded continuously, there may be many integration solutions which are determined according to the minimum number of physical machines, and in the prior art, an integration solution with a better energy saving effect cannot be selected from these integration solutions.

SUMMARY OF THE INVENTION

Embodiments of the present invention provide a method, an apparatus, and a system for virtual cluster integration, so as to improve an energy saving and emission reduction effect of a virtual cluster integration solution.

For this purpose, the embodiments of the present invention provide the following technical solutions:

An embodiment of the present invention provides a virtual cluster integration method, where the method is applied in a virtual cluster system, the system includes M physical machines and N virtual machines hosted on the M physical machines, where M and N are integers greater than or equal to 1; and the method includes:

performing a calculation through a search algorithm to obtain the minimum number m of physical machines which are capable of accommodating the N virtual machines, and obtaining G virtual integration solutions for hosting the N virtual machines on the minimum number m of physical machines, where m is a positive integer less than or equal to M, and G is an integer greater than or equal to 1;

calculating CPU voltage consumption of each virtual integration solution: calculating a CPU utilization ratio of a $j^{th}$ physical machine $P_{ij}$ of an $i^{th}$ virtual integration solution; multiplying the CPU utilization ratio by a maximum value of a dominant frequency of the physical machine $P_{ij}$ to obtain a minimum CPU dominant frequency required by the physical machine $P_{ij}$ hosting a virtual machine; according to the minimum CPU dominant frequency of the physical machine $P_{ij}$, obtaining a voltage value associated with the minimum CPU dominant frequency from a mapping relationship between a CPU dominant frequency and a voltage, where the CPU dominant frequency and the voltage are of the physical machine; and adding up voltage values of m physical machines in the $i^{th}$ virtual integration solution to obtain CPU voltage consumption of the $i^{th}$ virtual integration solution, where i is a positive integer less than or equal to G, and j is a positive integer less than or equal to m; and determining a first virtual integration solution according to a minimum value which is of CPU voltage consumption and is calculated and obtained in the G virtual integration solutions; and if there is one first virtual integration solution, determining a virtual integration migration policy according to the first virtual integration solution.

An embodiment of the present invention provides a method for calculating CPU voltage energy consumption of a physical machine, where the method includes:

calculating a CPU utilization ratio of the physical machine;

multiplying the CPU utilization ratio of the physical machine by a maximum value of a dominant frequency of the physical machine to obtain a minimum CPU dominant frequency of the physical machine; and according to the minimum CPU dominant frequency, obtaining a voltage value associated with the minimum CPU dominant frequency from a mapping relationship between a CPU dominant frequency and a voltage, where the CPU dominant frequency and the voltage are of the physical machine.

An embodiment of the present invention provides a virtual cluster integration apparatus, where the apparatus includes:

a module for determining the minimum number of physical machines, configured to perform a calculation through a search algorithm to obtain the minimum number m of physical machines which are capable of accommodating N virtual machines, and obtain G virtual integration solutions for hosting the N virtual machines on the minimum number m of physical machines, where m is a positive integer less than or equal to M, and G is an integer greater than or equal to 1;

a CPU energy consumption calculating module, configured to calculate CPU voltage consumption of each virtual integration solution: calculate a CPU utilization ratio of a $j^{th}$ physical machine $P_{ij}$ of an $i^{th}$ virtual integration solution; multiply the CPU utilization ratio by a maximum value of a dominant frequency of the physical machine $P_{ij}$ to obtain a minimum CPU dominant frequency required by the physical machine $P_{ij}$ hosting a virtual machine; according to the minimum CPU dominant frequency of the physical machine $P_{ij}$, obtain a voltage value associated with the minimum CPU dominant frequency from a mapping relationship between a CPU dominant frequency and a voltage, where the CPU dominant frequency and the voltage are of the physical machine; and add up voltage values of m physical machines in the $i^{th}$ virtual integration solution to obtain CPU voltage consumption of the $i^{th}$ virtual integration solution, where i is a positive integer less than or equal to G, and j is a positive integer less than or equal to m; and a migration policy formulating module, configured to determine a first virtual integration solution according to a minimum value which is of CPU voltage consumption and is calculated and obtained in the G virtual integration solutions; and if there is one first virtual integration solution, determine a virtual integration migration policy according to the first virtual integration solution.

An embodiment of the present invention provides a virtual cluster system, including M physical machines and N virtual machines hosted on the M physical machines, where M and N are integers greater than or equal to 1, and any physical machine in the M physical machines is deployed with a virtual cluster integration apparatus provided in an embodiment of the present invention.

To sum up, through the method, the apparatus, and the system for virtual cluster integration provided in the embodiments of the present invention, on the basis of the virtual integration solutions where the minimum number of physical machines is obtained, by calculating CPU voltage consumption of each virtual integration solution, a virtual integration solution with lowest CPU voltage consumption can be selected, so as to obtain a virtual integration solution with lower CPU voltage energy consumption, thereby greatly improving the energy saving and emission reduction effect of the virtual cluster integration solution.

BRIEF DESCRIPTION OF THE DRAWINGS

To illustrate the technical solutions in the embodiments of the present invention or in the prior art more clearly, the accompanying drawings required for describing the embodiments or the prior art are introduced briefly in the following. Apparently, the accompanying drawings in the following descriptions are merely some embodiments of the present invention, and persons of ordinary skill in the art can further obtain other drawings according to these accompanying drawings without creative efforts.

DETAILED DESCRIPTION OF THE EMBODIMENTS

The technical solutions in the embodiments of the present invention are described clearly and completely in the following with reference to the accompanying drawings in the embodiments of the present invention. Apparently, the described embodiments are only some embodiments of the present invention, rather than all the embodiments. All other embodiments obtained by those skilled in the art based on the embodiments of the present invention without making any creative effort shall fall within the protection scope of the present invention.

Figure 1:
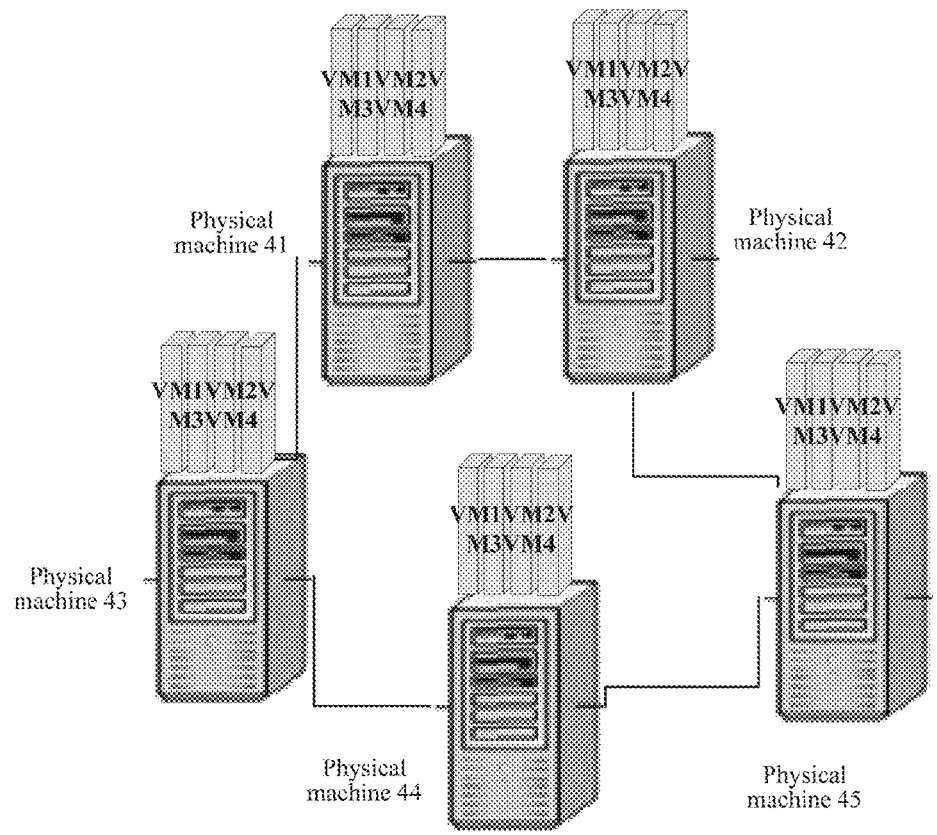
FIG. 1 is a schematic diagram of physical deployment of a virtual cluster system according to an embodiment of the present invention.

Referring to FIG. 1, it is a schematic diagram of physical deployment of a virtual cluster system according to an embodiment of the present invention. As shown in FIG. 1, the virtual cluster system includes five physical machines (physical machines 41, 42, 43, 44, and 45) and multiple virtual machines (VM1, VM2, VM3, and VM4) hosted on the physical hosts. FIG. 1 shows a current deployment condition of the virtual cluster system. A virtual integration solution mentioned in the embodiment of the present invention is a deployment condition which is after virtual cluster migration or change and is obtained in consideration of various factors, which includes the number of physical machines and which virtual machines should be deployed on each physical machine. In the virtual integration solution, first, according to prediction of some conditions, specifically determine to select which virtual integration solution, and then formulate a specific virtual cluster migration policy to change the virtual cluster from an original deployment condition to a target deployment condition.

It should be noted that FIG. 1 is just an example for description and is not intended to limit the number of physical machines and virtual machines corresponding to the virtual cluster system provided in the embodiment of the present invention. Moreover, the number of virtual machines deployed on each physical machine may be the same, and may also be different. Virtual machines VM1, VM2, VM3, and VM4 are just used for convenience of representation, and not intended to impose a limitation that virtual machines on each physical machine have the same configuration. In fact, a scale of a current virtual cluster system is much greater than that shown in FIG. 1. Generally, hundreds of physical machines are deployed with thousands of virtual machines. For a virtual cluster integration method provided in the embodiment of the present invention, the larger the scale of the virtual cluster system is, the more obvious a beneficial effect generated by the virtual cluster integration method provided in the embodiment of the present invention is.

A physical machine 44 of the virtual cluster system shown in FIG. 1 is deployed with a virtual cluster integration apparatus provided in an embodiment of the present invention. The apparatus is configured to: perform a calculation through a search algorithm to obtain the minimum number m of physical machines which are capable of accommodating N virtual machines, and obtain G virtual integration solutions for hosting the N virtual machines on the minimum number m of physical machines, where m is a positive integer less than or equal to M, and G is an integer greater than or equal to 1; calculate CPU voltage consumption of each virtual integration solution: calculate a CPU utilization ratio of a $j^{th}$ physical machine $P_{ij}$ of an $i^{th}$ virtual integration solution; multiply the CPU utilization ratio by a maximum value of a dominant frequency of the physical machine $P_{ij}$ to obtain a minimum CPU dominant frequency required by the physical machine $P_{ij}$ hosting a virtual machine; according to the minimum CPU dominant frequency of the physical machine $P_{ij}$, obtain a voltage value associated with the minimum CPU dominant frequency from a mapping relationship between a CPU dominant frequency and a voltage, where the CPU dominant frequency and the voltage are of a physical machine; and add up voltage values of m physical machines in the $i^{th}$ virtual integration solution to obtain CPU voltage consumption of the $i^{th}$ virtual integration solution, where i is a positive integer less than or equal to G, and j is a positive integer less than or equal to m; and determine a first virtual integration solution according to a minimum value which is of CPU voltage consumption and is calculated and obtained in the G virtual integration solutions, and if there is one first virtual integration solution, determine a virtual integration migration policy according to the first virtual integration solution.

Further, the first virtual integration solution is determined according to the minimum value which is of the CPU voltage consumption and is calculated and obtained in the G virtual integration solutions, and if there are multiple first virtual integration solutions, the virtual integration migration policy is determined according to a virtual integration solution which is with a minimum sum of memory utilization ratios of virtual machines to be migrated and is in the first virtual integration solutions.

It should be understood that, in an embodiment of another virtual cluster system, the virtual cluster integration apparatus provided in the embodiment of the present invention may also be deployed on any physical machine or a virtual machine hosted on any physical machine shown in FIG. 1.

In an exemplary implementation manner, each physical machine includes a hardware layer and a virtual machine monitor unit VMM (Virtual Machine Monitor) running on the hardware layer, where the VMM is configured to obtain a mapping relationship between a CPU dominant frequency and a voltage, where the CPU dominant frequency and the voltage are of the physical machine, and delivers the mapping relationship to the physical machine 44 deployed with the virtual cluster integration apparatus. In another implementation manner, mapping relationships between CPU dominant frequencies and voltages may be manually stored on the physical machine 44, and manually updated, where the CPU dominant frequencies and the voltages are of all physical machines.

It should be noted that, the virtual cluster integration apparatus provided in the embodiment of the present invention may also be deployed inside an independent physical machine or a virtual machine hosted on the physical machine outside the virtual cluster integration system provided in the embodiment of the present invention, the independent physical machine or virtual machine executes formulation of a virtual migration policy of the whole cluster, and the physical machine or virtual machine deployed with the virtual cluster integration apparatus of the embodiment of the present invention usually has a communication connection with the virtual cluster integration system of the embodiment of the present invention.

Figure 2:
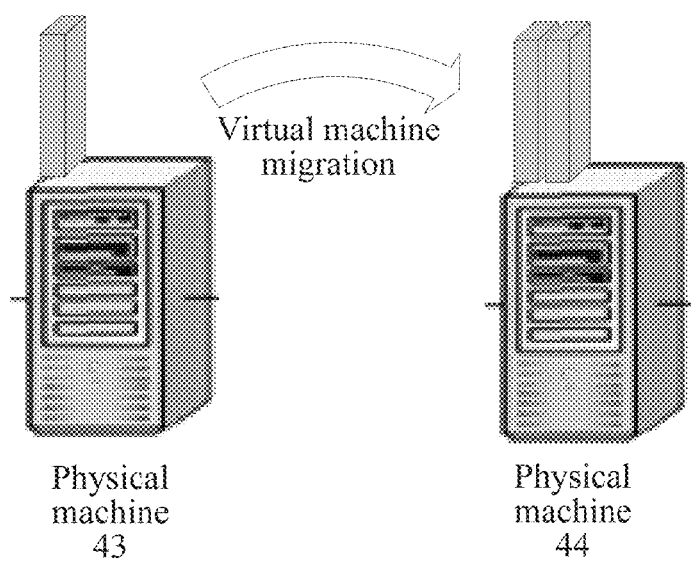
FIG. 2 is a schematic diagram of virtual machine migration according to an embodiment of the present invention.
Figure 3:
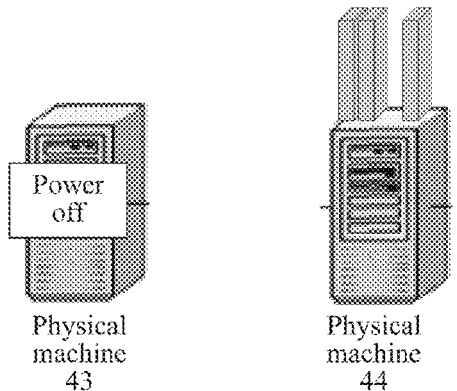
FIG. 3 is a schematic diagram of powering off a virtual machine according to an embodiment of the present invention.

For example, when a load of the virtual cluster system is lower than a specific threshold value, integration of the virtual cluster may also be performed by using the foregoing method. First, resource data in the cluster is obtained, including a resource utilization ratio of the virtual machine, and a resource utilization ratio of the physical machine, resources here include a CPU, a memory, a storage IO rate, and a transmitting and receiving rate of a network, and the resource utilization ratio data is collected at a fixed interval. Then, the virtual cluster integration apparatus on the physical machine 44 formulates the virtual integration migration policy according to a mapping relationship between a CPU voltage and a dominant frequency, where the CPU voltage and the dominant frequency are of each physical machine. The process is not repeatedly described here again. It is assumed that the minimum number m of physical machines in the finally determined virtual integration solution is 4, which are physical machines 41, 42, 44, and 45. As shown in FIG. 2, a virtual machine on the physical machine 43 needs to be migrated to another physical machine such as the physical machine 44. After the migration is completed, an instruction for powering off the physical machine 43 is executed, as shown in FIG. 3. If a CPU dominant frequency of another physical machine may be adjusted, the CPU dominant frequency of another physical machine is also adjusted to the foregoing calculated minimum CPU dominant frequency.

To sum up, through the virtual cluster system provided in the embodiment of the present invention, when the virtual cluster integration is executed, on the basis of a virtual integration solution where the minimum number of physical machines is obtained, a virtual integration solution with lowest CPU voltage consumption can be selected by calculating CPU voltage consumption of each virtual integration solution, so as to obtain a virtual integration solution with lower CPU voltage energy consumption, thereby greatly improving an energy saving and emission reduction effect of the virtual cluster integration solution.

Further, through the virtual cluster system provided in the embodiment of the present invention, in a process of formulating a hot spot elimination policy of the virtual cluster, a migration destination physical machine with minimum CPU voltage adjustment can be selected, thereby greatly improving the energy saving and emission reduction effect of the virtual cluster integration solution.

Figure 4:
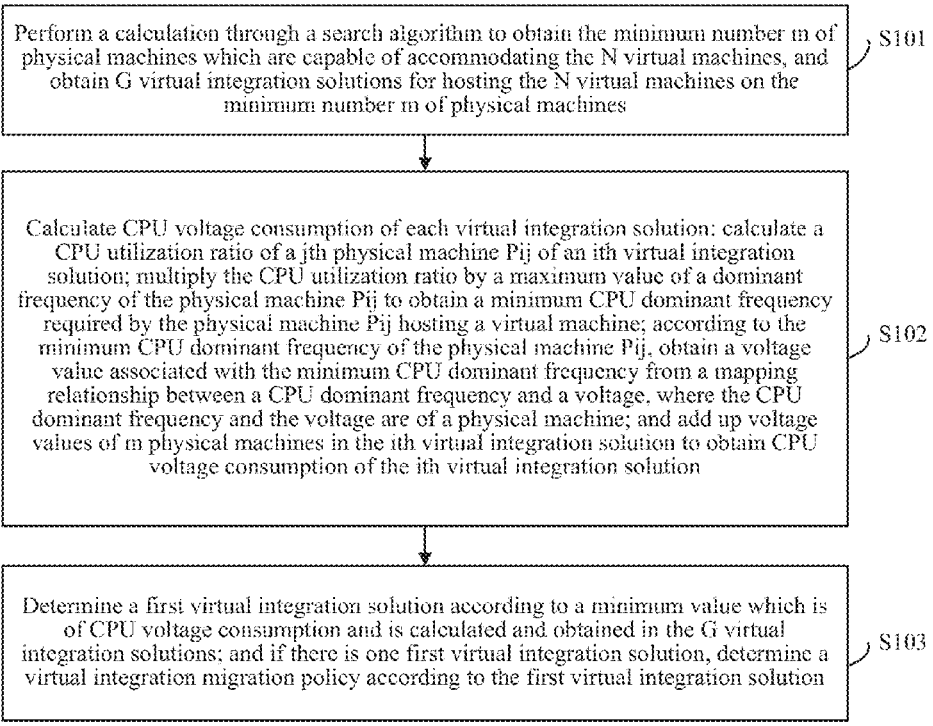
FIG. 4 is a schematic flow chart of a virtual cluster integration method according to an embodiment of the present invention.

Referring to FIG. 4, it is a schematic flow chart of a virtual cluster integration method according to an embodiment of the present invention. The method may be applied in a virtual cluster system, where the system includes M physical machines and N virtual machines hosted on the M physical machines, and M and N are integers greater than or equal to 1. The method includes:

Step S101: Perform a calculation through a search algorithm to obtain the minimum number m of physical machines which are capable of accommodating the N virtual machines, and obtain G virtual integration solutions for hosting the N virtual machines on the minimum number m of physical machines, where m is a positive integer less than or equal to M, and G is an integer greater than or equal to 1.

It should be noted that, the search algorithm may be any search algorithm which is capable of calculating the minimum number of physical machines according to conditions, such as a constraint planning algorithm or a genetic algorithm.

A process of solving the minimum number of physical machines and a virtual integration solution satisfying the minimum number of physical machines is introduced in detail in the following by taking the constraint planning algorithm as an example:

The idea of the constraint planning algorithm is as follows:

Constraint conditions: a sum of resource requirement quantities of virtual machines on any physical machine Pk is less than or equal to a sum of resource supply capacities of the physical machine Pk; (Resources may refer to a CPU, a memory, and/or other resources.)

On the premises of satisfying the foregoing constraint conditions, solutions for deploying all N virtual machines on the physical machines are obtained through the search algorithm.

For each deployment solution, the number of physical machines deployed with virtual machines is solved.

The number of physical machines deployed with virtual machines in each deployment solution is compared, the minimum number of the physical machines among them is selected as the minimum number m of physical machines which are capable of accommodating all virtual machines, and G deployment solutions corresponding to the minimum number m of physical machines are taken as virtual integration solutions satisfying the minimum number m of physical machines.

First, in order to make persons of ordinary skill in the art understand the embodiment of the present invention, several definitions are introduced first in the following:

1. A physical machine set in the virtual cluster is $N=n\{n_1, n_2, n_3 \ldots\}$, where $n_i$ represents an $i^{th}$ physical machine in the virtual cluster; and a virtual machine set in the virtual cluster is $V=\{v_1, v_2, v_3, \ldots\}$, where $v_j$ represents a $j^{th}$ virtual machine in the virtual cluster.

2. Each physical machine $n_i$ corresponds to a vector $H_i$, and $H_i=\{h_{i1}, \ldots h_{ij}, \ldots\}$ indicates whether a virtual machine is deployed on the physical machine $n_i$, where $h_{ij}=1$ represents that a virtual machine $v_j$ is deployed on the physical machine $n_i$, and $h_{ij}=0$ represents that the virtual machine $v_j$ is not deployed on the physical machine $n_i$. For example, 5 virtual machines and 2 physical hosts exist in the virtual cluster; and if $H_2=\{1,0,1,0,0\}$ of a second physical host represents that the physical machine is deployed with the first and third virtual machines, and is not deployed with the second, fourth, and fifth virtual machines.

3. Rp represents a CPU resource requirement vector of each virtual machine, $Cp(n_i)$ represents a CPU resource capacity vector of the physical machine $n_i$, Rm represents a memory resource requirement vector of each virtual machine, and $Cm(n_i)$ represents a CPU memory capacity vector of the physical machine $n_i$.

Constraint conditions of a planning algorithm may be indicated as the following inequalities:

$$\begin{cases} Rp * H_i \leq Cp(n_i) & \forall n_i \in N \\ Rm * H_i \leq Cm(n_i) & \forall n_i \in N \end{cases}$$

According to the foregoing constraint conditions, the objective of the planning algorithm is minimizing a variable X, where X is defined as follows:

$X=\Sigma|H_i|$, where $|H_i|=0$ indicates that no virtual machine is deployed on the physical machine $n_i$, and $|H_i|\neq 0$ indicates that the physical machine $n_i$ is deployed with at least one virtual machine, that is, there is at least one $h_{ij}=1$.

This problem is similar to a problem of multiple knapsacks. A minimum solution X=m may be found through a constraint planning method, where m is the minimum number of physical machines which are capable of accommodating all virtual machines, and at the same time, a vector $H_i$ satisfying $\Sigma|H_i|=m$ may be obtained. Vectors $H_i$ of all physical machines represent a feasible virtual cluster integration solution.

It should be noted that, although the minimum value m is unique, there may be multiple feasible solutions satisfying $\Sigma|H_i|=m$. In fact, in a case that the scale of the virtual cluster is relatively large, the number of feasible virtual cluster integration solutions which satisfy $\Sigma|H_i|=m$ and are solved through the method provided in the embodiment of the present invention is often more than one. Therefore, the energy consumption of each virtual cluster integration solution needs to be calculated by performing the CPU energy consumption calculating steps provided in the embodiment of the present invention, and then a solution with the lowest energy consumption among the solutions is selected.

Step S102: Calculate CPU voltage consumption of each virtual integration solution: calculate a CPU utilization ratio of a $j^{th}$ physical machine $P_{ij}$ of an $i^{th}$ virtual integration solution; multiply the CPU utilization ratio by a maximum value of a dominant frequency of the physical machine $P_{ij}$ to obtain a minimum CPU dominant frequency required by the physical machine $P_{ij}$ hosting a virtual machine; according to the minimum CPU dominant frequency of the physical machine $P_{ij}$, obtain a voltage value associated with the minimum CPU dominant frequency from a mapping relationship between a CPU dominant frequency and a voltage, where the CPU dominant frequency and the voltage are of the physical machine; and add up voltage values of m physical machines in the $i^{th}$ virtual integration solution to obtain CPU voltage consumption of the $i^{th}$ virtual integration solution, where i is a positive integer less than or equal to G, and j is a positive integer less than or equal to m.

If a CPU voltage consumption cost of a virtual cluster integration solution p is defined as f(p), and voltage consumption of each physical machine in the virtual cluster integration solution is $D(n_i)$, then:

$$f(p)=\Sigma D(n_i) \; i\in[1,m]$$

The calculation of the voltage consumption $D(n_i)$ of each physical machine is as follows:

If no virtual machine exists on the physical machine $n_i$, $D(n_i)=0$.

If a virtual machine exists on the physical machine $n_i$, first, the CPU utilization ratio of the physical machine $n_i$ is calculated. In one implementation manner, the CPU utilization ratio of the physical machine $n_i$ is a sum of CPU utilization ratios of all virtual machines deployed on the physical machine $n_i$, and in another implementation manner, the CPU utilization ratio of the physical machine $n_i$ may also include CPU utilization ratios of other software and hardware which consume CPU resources. Then, the CPU utilization ratio is multiplied by the maximum value of the dominant frequency of the physical machine $n_i$ (the maximum value of the dominant frequency may be obtained by searching a mapping relationship between a dominant frequency and a voltage, where the dominant frequency and the voltage are of the physical machine), and the obtained product is the minimum dominant frequency to which the physical machine $n_i$ may be adjusted. Then, a mapping relationship between a CPU dominant frequency and a voltage is searched according to the minimum dominant frequency to obtain a voltage value associated with the minimum dominant frequency, and the voltage value is $D(n_i)$ where the CPU dominant frequency and the voltage are of the physical machine $n_i$. For example, the CPU utilization ratio of the physical machine $n_i$ is 70%, it is assumed that Table 1 describes the mapping relationship between the dominant frequency and the voltage, where the dominant frequency and the voltage are of the physical machine $n_i$, and it can be obtained from the table that, the maximum value of the dominant frequency of the physical machine $n_i$ is 1.4 GHz, so the minimum dominant frequency to which the physical machine $n_i$ may be adjusted is 1.4 GHz×70%=0.98 GHz. If a voltage corresponding to 0.98 GHz exists in Table 1, the voltage value is $D(n_i)$. However, in this case, no voltage value corresponding to 0.98 GHz exists in Table 1. In an exemplary implementation manner, the frequency may be selected to decrease to 1 GHz (if the frequency is decreased to be lower, the requirements cannot be satisfied), a voltage value corresponding to 1 GHz is 1.308 V, that is, $D(n_i)$=1.308 V.

TABLE 1

| Dominant Frequency (GHz) | Voltage (V) |
|---|---|
| 1.4 | 1.484 |
| 1.2 | 1.436 |
| 1.0 | 1.308 |
| 0.8 | 1.180 |
| 0.6 | 0.956 |

Except $\Sigma|H_i|=m$, other constraint conditions are the same as those in step S101.

Now, a target function is changed to solve a minimum value of f(p). The problem may also be solved through a constraint planning method, and an executable solution is output.

Step S103: Determine a first virtual integration solution according to a minimum value which is of CPU voltage consumption and is calculated and obtained in the G virtual integration solutions; and if there is one first virtual integration solution, determine a virtual integration migration policy according to the first virtual integration solution.

The first virtual integration solution is determined according to the minimum value of f(p) calculated in step S102, and the CPU voltage consumption of the first virtual integration solution is equal to the minimum value of f(p).

If there is only one selected first virtual integration solution with CPU voltage consumption being equal to the minimum value of f(p), the virtual integration migration policy is formulated according to the only one first virtual integration solution.

Further, the method of the embodiment of the present invention includes: if there are multiple first virtual integration solutions, determining the virtual integration migration policy according to a virtual integration solution which is with a minimum sum of memory utilization ratios of virtual machines to be migrated and is in the first virtual integration solutions. For example, it is assumed that there are three first virtual integration solutions with CPU voltage consumption being equal to the minimum value of f(p), in the process of formulating the virtual integration policy, the three virtual integration solutions may each output a virtual machine migration list, where the virtual machine migration list records names of all virtual machines to be migrated, a source physical machine where the virtual machines are located, and a destination physical machine to which the virtual machines is migrated if the virtual cluster is migrated to a target state. Then, a sum of memory utilization ratios of the virtual machines to be migrated is calculated to obtain migration consumption of each virtual integration solution, and a virtual integration solution with the lowest migration consumption among them is selected as a final virtual integration solution.

It should be noted that, in a specific practice process, if there are multiple virtual integration solutions which satisfy the conditions and are obtained through the foregoing steps, a virtual integration solution to be finally adopted may be selected according to the requirements of the virtual cluster integration or another method, which is not limited in the embodiment of the present invention.

It should be noted that, persons of ordinary skill in the art may understand that the virtual cluster integration method provided in the embodiment of the present invention may be applicable to any case in which a virtual machine needs to be redeployed on the physical machine or be migrated. The embodiment of the present invention is just an example for description and does not impose a limitation.

Figure 5:
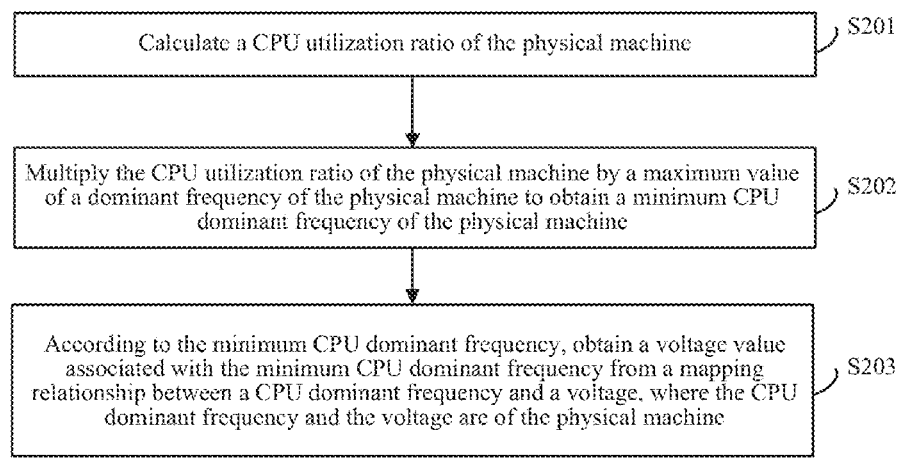
FIG. 5 is a schematic flow chart of a method for calculating CPU voltage energy consumption of a physical machine according to an embodiment of the present invention.

The embodiment of the present invention introduces a process that the CPU voltage energy consumption of the virtual integration solution is applied in the selection of the virtual cluster integration solution. The embodiment of the present invention further provides another application scene of CPU voltage energy consumption of the virtual integration solution: If CPU (or memory) utilization ratios of one or more physical machines in the virtual cluster exceed a specific threshold value, the physical machines become hot spots in the virtual cluster. In this case, virtual machines on the physical machines need to be migrated, so that the CPU (or memory) utilization ratios are decreased to be lower than the threshold value so as to eliminate the hot spots in the virtual cluster. A migration destination of a virtual machine may be selected by considering the factor of a CPU voltage energy consumption of a physical machine. A specific method is shown as FIG. 5.

Step S201: Calculate a CPU utilization ratio of the physical machine.

The CPU utilization ratio may be a sum of CPU utilization ratios of all virtual machines to be migrated plus a sum of CPU utilization ratios of all virtual machines currently deployed on the physical machine.

Step S202: Multiply the CPU utilization ratio of the physical machine by a maximum value of a dominant frequency of the physical machine to obtain a minimum CPU dominant frequency of the physical machine.

Step S203: According to the minimum CPU dominant frequency, obtain a voltage value associated with the minimum CPU dominant frequency from a mapping relationship between a CPU dominant frequency and a voltage, where the CPU dominant frequency and the voltage are of the physical machine.

Then, a physical machine with a voltage value obtained through a calculation being equal or close to a current voltage value may be preferentially selected as a migration destination address of the virtual machine. For example, if a current voltage value is 1.5 V and a voltage value needing to be adjusted to is 1.5 V or 1.45 V, the voltage value may not be adjusted if the physical machine is used as a migration destination of the virtual machine, thereby improving the migration efficiency of the virtual machine. If no such physical machine which needs no voltage value adjustment exists, a physical machine with minimum CPU voltage adjustment (the physical machine with a smallest difference between the voltage value obtained through the calculation and the current voltage value) may be preferentially selected as the migration destination of the virtual machine.

Further, in a case that multiple virtual machines need to be migrated to relieve hot spots, the virtual machines to be migrated may be first sorted in a descending order of CPU utilization ratios, a virtual machine with a maximum CPU utilization ratio is processed preferentially, and a destination selection policy of the virtual machine is as described in the foregoing.

To sum up, through the virtual cluster integration method provided in the embodiment of the present invention, on the basis of the virtual integration solutions where the minimum number of physical machines is obtained, a virtual integration solution with lowest CPU voltage consumption is selected by calculating CPU voltage consumption of each virtual integration solution, so as to select a virtual integration solution with lower CPU voltage energy consumption, thereby greatly improving an energy saving and emission reduction effect of the virtual cluster integration solution.

Further, through the method which is for calculating CPU voltage energy consumption of a physical machine and is provided in the embodiment of the present invention, in a process of formulating a hot spot elimination policy of the virtual cluster, a migration destination physical machine with minimum CPU voltage adjustment can be selected, thereby greatly improving the energy saving and emission reduction effect of the virtual cluster integration solution.

Figure 6:
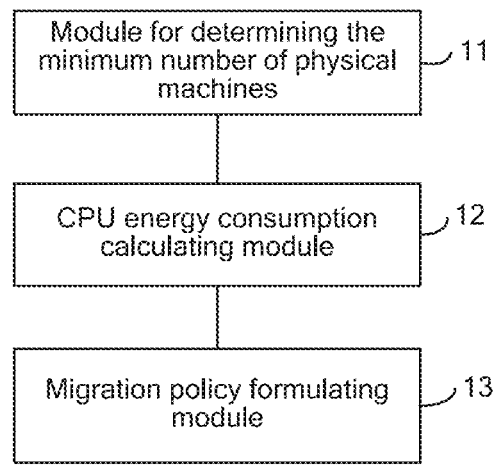
FIG. 6 is a schematic structural diagram of a virtual cluster integration apparatus according to an embodiment of the present invention.

Referring to FIG. 6, it is a schematic diagram of logic modules of a virtual cluster integration apparatus according to an embodiment of the present invention. As shown in FIG. 6, the apparatus includes:

a module 11 for determining the minimum number of physical machines, configured to perform a calculation through a search algorithm to obtain the minimum number m of physical machines which are capable of accommodating N virtual machines, and obtain G virtual integration solutions for hosting the N virtual machines on the minimum number m of physical machines, where m is a positive integer less than or equal to M, and G is an integer greater than or equal to 1;

a CPU energy consumption calculating module 12, configured to calculate CPU voltage consumption of each virtual integration solution: calculate a CPU utilization ratio of a $j^{th}$ physical machine $P_{ij}$ of an $i^{th}$ virtual integration solution; multiply the CPU utilization ratio by a maximum value of a dominant frequency of the physical machine $P_{ij}$ to obtain a minimum CPU dominant frequency required by the physical machine $P_{ij}$ hosting a virtual machine; according to the minimum CPU dominant frequency of the physical machine $P_{ij}$, obtain a voltage value associated with the minimum CPU dominant frequency from a mapping relationship between a CPU dominant frequency and a voltage, where the CPU dominant frequency and the voltage are of the physical machine; and add up voltage values of m physical machines in the $i^{th}$ virtual integration solution to obtain CPU voltage consumption of the $i^{th}$ virtual integration solution, where i is a positive integer less than or equal to G, and j is a positive integer less than or equal to m; and a migration policy formulating module 13, configured to determine a first virtual integration solution according to a minimum value which is of CPU voltage consumption and is calculated and obtained in the G virtual integration solutions; and if there is one first virtual integration solution, determine a virtual integration migration policy according to the first virtual integration solution.

Further, the migration policy formulating module 13 is further configured to: if there are multiple first virtual integration solutions, determine a virtual integration migration policy according to a virtual integration solution which is with a minimum sum of memory utilization ratios of virtual machines to be migrated and is in the first virtual integration solutions.

It should be noted that, the division of modules in the apparatus shown in FIG. 6 is just an example for description, and another module division manner which is easily obtained by persons of ordinary skill in the art should fall within the protection scope of the embodiment of the present invention as long as the manner satisfies the method provided in the embodiment of the prevent invention. In addition, these functional modules may be deployed on a same physical machine, and may also be deployed on different physical machines, which is not limited in the embodiment of the present invention.

To sum up, through the virtual cluster integration method provided in the embodiment of the present invention, on the basis of the virtual integration solutions where the minimum number of physical machines is obtained, a virtual integration solution with lowest CPU voltage consumption is selected by calculating CPU voltage consumption of each virtual integration solution, so as to select a virtual integration solution with lower CPU voltage energy consumption, thereby greatly improving an energy saving and emission reduction effect of the virtual cluster integration solution.

Further, through the method which is for calculating CPU voltage energy consumption of a physical machine and is provided in the embodiment of the present invention, in a process of formulating a hot spot elimination policy of the virtual cluster, a migration destination physical machine with minimum CPU voltage adjustment can be selected, thereby greatly improving the energy saving and emission reduction effect of the virtual cluster integration solution.

Persons of ordinary skill in the art may understand that all or a part of the procedures of the method in the foregoing embodiments may be implemented by a computer program instructing relevant hardware (such as a processor). The program may be stored in a computer readable storage medium. When the program is executed, the procedures of each foregoing method according to the embodiments are performed. The storage medium may be a magnetic disk, a compact disk, a read-only memory (Read-Only Memory, ROM), or a random access memory (Random Access Memory, RAM).

The foregoing descriptions are only specific implementation manners of the present invention. It should be noted that, those skilled in the art can further make various improvements and modifications without departing from the principle of the present invention, and the improvements and modifications should fall within the protection scope of the present invention.

What is claimed is:

1. A method, implemented in a virtualized cluster system comprising a plurality of physical machines (PMs), for selecting a PM from the plurality of PMs as a migration destination for at least one virtual machine (VM) to be migrated based on calculating CPU voltage energy consumption of the PMs, the method comprising:

identifying at least one VM currently deployed on a first PM of the plurality of PMs which is to be migrated to another PM of the plurality of PMs;

for each of the PMs other than the first PM:
    calculating a CPU utilization ratio of the PM, wherein the CPU utilization ratio of the PM is a CPU utilization ratio of the identified VM to be migrated plus a sum of CPU utilization ratios of VMs currently deployed on the PM;
    obtaining a minimum CPU dominant frequency of the PM by multiplying the CPU utilization ratio of the PM by a maximum value of a dominant frequency of the PM;
    obtaining a pre-stored table comprising mapping relationships between CPU dominant frequencies and voltage values for the PM;
    obtaining a voltage value associated with the minimum CPU dominant frequency from the pre-stored table; and
    calculating a CPU voltage adjustment of the PM comprising a difference between the obtained voltage value and a current CPU voltage of the PM;
selecting the PM of the other PMs with minimum relative CPU voltage adjustment as the migration destination, wherein there is at least one PM selected as the migration destination for one of the at least one VM to be migrated with a voltage adjustment greater than zero; and
migrating the identified VM from the first PM to the selected PM and adjusting the current CPU voltage of the selected PM to the obtained voltage value.

2. The method according to claim 1, wherein the at least one VM to be migrated comprises a plurality of VMs, the method further comprising:
    sorting the VMs to be migrated in descending order of their CPU utilization ratios and performing the method of selecting a PM migration destination for each of the VMs to be migrated beginning with the VM with the highest relative CPU utilization ratio.

3. The method according to claim 1, wherein the first PM comprises a PM of the plurality of PMs whose resource utilization has exceeded a specified threshold value.

4. The method according to claim 3, wherein identifying at least one VM to be migrated from the first PM comprises identifying one or more VMs currently deployed on the first PM such that the resource utilization of the first PM will be lower than the threshold value after the identified VMs are migrated.

5. The method according to claim 3, wherein the resource comprises one of CPU and memory.

6. A virtualized cluster system comprising a plurality of physical machines (PMs) which is configured to perform a method to select a PM from the plurality of PMs as a migration destination for at least one virtual machine (VM) to be migrated based on calculating CPU voltage energy consumption of the PMs, the method comprising:
    identifying at least one VM currently deployed on a first PM of the plurality of PMs which is to be migrated to another PM of the plurality of PMs;
    for each of the PMs other than the first PM:
        calculating a CPU utilization ratio of the PM, wherein the CPU utilization ratio of the PM is a CPU utilization ratio of the identified VM to be migrated plus a sum of CPU utilization ratios of VMs currently deployed on the PM;
        obtaining a minimum CPU dominant frequency of the PM by multiplying the CPU utilization ratio of the PM by a maximum value of a dominant frequency of the PM;
        obtaining a pre-stored table comprising mapping relationships between CPU dominant frequencies and voltage values for the PM;
        obtaining a voltage value associated with the minimum CPU dominant frequency from the pre-stored table; and
        calculating a CPU voltage adjustment of the PM comprising a difference between the obtained voltage value and a current CPU voltage of the PM;
    selecting the PM of the other PMs with minimum relative CPU voltage adjustment as the migration destination, wherein there is at least one PM selected as the migration destination for one of the at least one VM to be migrated with a voltage adjustment greater than zero; and
    migrating the identified VM from the first PM to the selected PM and adjusting the current CPU voltage of the selected PM to the obtained voltage value.

7. The virtualized cluster system of claim 6, wherein the at least one VM to be migrated comprises a plurality of VMs, the system further configured to:
    sort the VMs to be migrated in descending order of their CPU utilization ratios and perform the method to select a PM migration destination for each of the VMs to be migrated beginning with the VM with the highest relative CPU utilization ratio.

8. The virtualized cluster system of claim 6, wherein the first PM comprises a PM of the plurality of PMs whose resource utilization has exceeded a specified threshold value.

9. The virtualized cluster system of claim 8, wherein identifying at least one VM to be migrated from the first PM comprises identifying one or more VMs currently deployed on the first PM such that the resource utilization of the first PM will be lower than the threshold value after the identified VMs are migrated.

10. The virtualized cluster system of claim 8, wherein the resource comprises one of CPU and memory.

11. A non-transitory computer-readable storage medium storing instructions which, when executed by a processor, perform a method in a virtualized cluster system comprising a plurality of physical machines (PMs), the method for selecting a PM from the plurality of PMs as a migration destination for at least one virtual machine (VM) to be migrated based on calculating CPU voltage energy consumption of the PMs, the method comprising:
    identifying at least one VM currently deployed on a first PM of the plurality of PMs which is to be migrated to another PM of the plurality of PMs;
    for each of the PMs other than the first PM:
        calculating a CPU utilization ratio of the PM, wherein the CPU utilization ratio of the PM is a CPU utilization ratio of the identified VM to be migrated plus a sum of CPU utilization ratios of VMs currently deployed on the PM;
        obtaining a minimum CPU dominant frequency of the PM by multiplying the CPU utilization ratio of the PM by a maximum value of a dominant frequency of the PM;
        obtaining a pre-stored table comprising mapping relationships between CPU dominant frequencies and voltage values for the PM;
        obtaining a voltage value associated with the minimum CPU dominant frequency from the pre-stored table; and
        calculating a CPU voltage adjustment of the PM comprising a difference between the obtained voltage value and a current CPU voltage of the PM;

selecting the PM of the other PMs with minimum relative CPU voltage adjustment as the migration destination, wherein there is at least one PM selected as the migration destination for one of the at least one VM to be migrated with a voltage adjustment greater than zero; and migrating the identified VM from the first PM to the selected PM and adjusting the current CPU voltage of the selected PM to the obtained voltage value.

12. The non-transitory computer readable storage medium of claim 11, wherein the at least one VM to be migrated comprises a plurality of VMs, the instructions being further executable to:

sort the VMs to be migrated in descending order of their CPU utilization ratios and performing the method of selecting a PM migration destination for each of the VMs to be migrated beginning with the VM with the highest relative CPU utilization ratio.

13. The non-transitory computer readable storage medium of claim 11, wherein the first PM comprises a PM of the plurality of PMs whose resource utilization has exceeded a specified threshold value.

14. The non-transitory computer readable storage medium of claim 13, wherein identifying at least one VM to be migrated from the first PM comprises identifying one or more VMs currently deployed on the first PM such that the resource utilization of the first PM will be lower than the threshold value after the identified VMs are migrated.

15. The non-transitory computer readable storage medium of claim 13, wherein the resource comprises one of CPU and memory.

* * * * *